United States Patent
Ahn et al.

(10) Patent No.: US 7,054,201 B2
(45) Date of Patent: May 30, 2006

(54) DRIVING CIRCUIT FOR NON-VOLATILE DRAM

(75) Inventors: Jin-Hong Ahn, Ichon-shi (KR);
Sang-Hoon Hong, Ichon-shi (KR);
Sang-Don Lee, Ichon-shi (KR);
Yil-Wook Kim, Ichon-shi (KR);
Young-Jun Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 106 days.

(21) Appl. No.: 10/883,151

(22) Filed: Jun. 30, 2004

(65) Prior Publication Data
US 2005/0141316 A1    Jun. 30, 2005

(30) Foreign Application Priority Data
Dec. 30, 2003 (KR) .................. 10-2003-0099897
Feb. 13, 2004 (KR) .................. 10-2004-0009745

(51) Int. Cl.
*G11C 16/04* (2006.01)
(52) U.S. Cl. ................. 365/185.28; 365/185.24; 365/185.25
(58) Field of Classification Search ............ 365/226, 365/185.28, 185.24, 185.25
See application file for complete search history.

(56) References Cited

U.S. PATENT DOCUMENTS

| | | | | |
|---|---|---|---|---|
| 4,471,471 A | * | 9/1984 | DiMaria ............... | 365/185.08 |
| 5,331,188 A | * | 7/1994 | Acovic et al. ........... | 257/298 |
| 2005/0041474 A1 | * | 2/2005 | Ahn et al. .............. | 365/185.18 |
| 2005/0047194 A1 | * | 3/2005 | Ahn et al. .............. | 365/149 |

* cited by examiner

*Primary Examiner*—Richard Elms
*Assistant Examiner*—Hien Nguyen
(74) *Attorney, Agent, or Firm*—Blakely Sokoloff Taylor & Zafman

(57) ABSTRACT

A driving circuit for use in a non-volatile dynamic random access memory (NVDRAM) having a nonconductor which can trap electrons or holes includes an internal supply voltage generator for generating the plurality of internal supply voltages, each having at least two different voltage levels; a mode controller for determining an operation mode of the NVDRAM; a voltage level selector for selecting one voltage level of each internal supply voltage in response to the operation mode to thereby outputs the selected voltage level of each internal supply voltage to the row decoding block and the core area; a row decoding block for receiving the internal supply voltages and outputting the internal supply voltages in response to an inputted address; and a core area having a plurality of unit cells, each storing a data, for accessing the data in response to inputted voltage levels of the plurality of internal supply voltages.

33 Claims, 8 Drawing Sheets

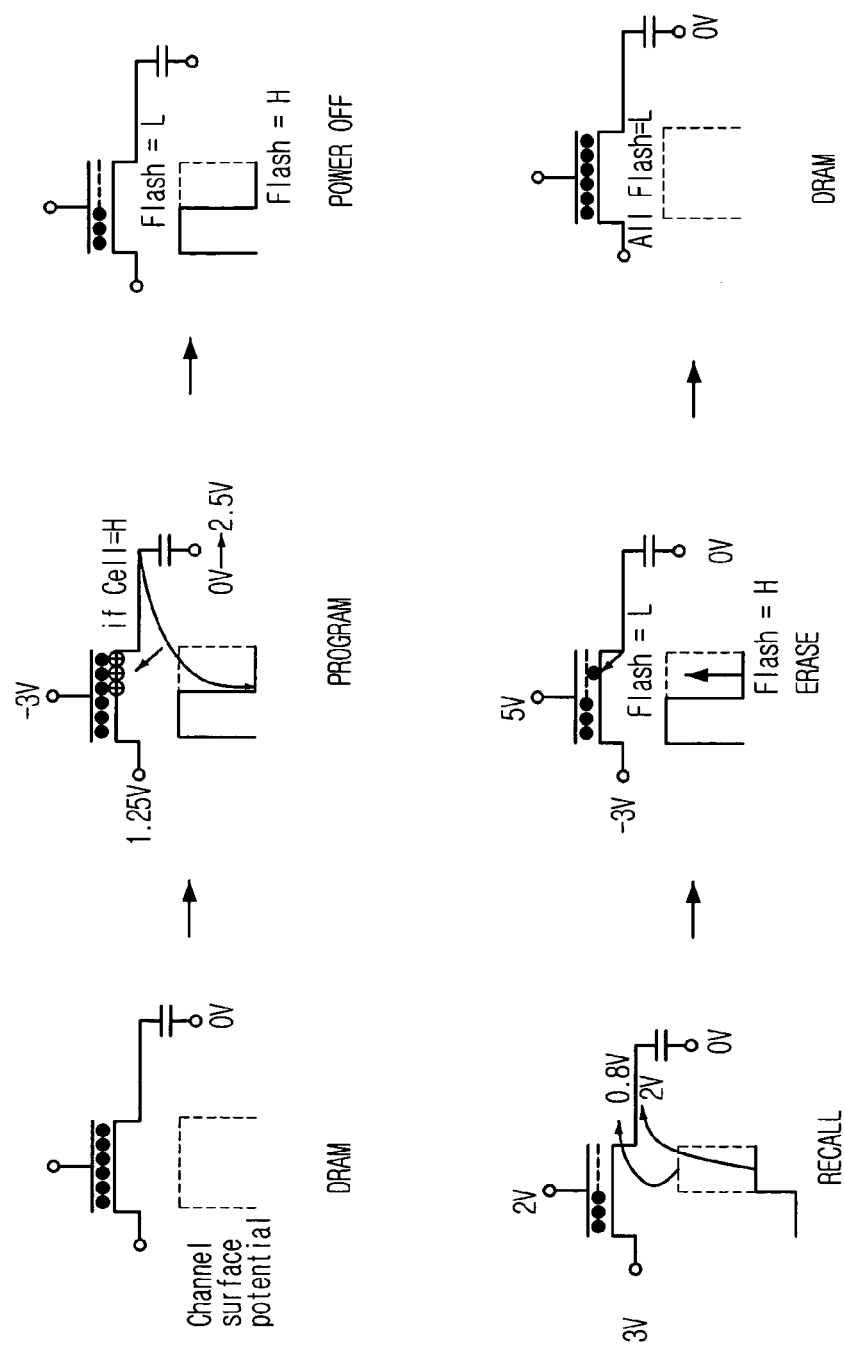

DRIVING CIRCUIT FOR NON-VOLATILE DRAM

FIELD OF INVENTION

The present invention relates to a non-volatile dynamic random access memory (NVDRAM); and, more particularly, to the NVDRAM having a trapping layer which can trap an electron or holes.

DESCRIPTION OF PRIOR ART

In general, a semiconductor memory device can be classified into a random access memory (hereinafter, referred as RAM) and a read only memory (hereinafter, referred as ROM). The RAM is volatile, where as the ROM is non-volatile. Namely, the ROM can keep stored data even though power supply is removed, but the RAM cannot keep stored data if the power supply is removed.

A plurality of RAMs, which take advantage of the ability of field effect transistors to store charge, have evolved and thus serve as memory cells. Such cells may be either dynamic or static in nature. As well know, the dynamic cells may employ only a single field effect transistor and the static cells may be arranged in a flip-flop configuration. These types of the cells may be referred to as volatile cells since information stored in these cells is lost when the power supply voltage applied to the memory is lost or turned off. In instances where stored volatile information must be retained, an alternate power supply, such as a battery system, must be coupled to the memory for use in the event of failure of the main power supply.

On the other hand, though a non-volatile memory such as ROM, EPROM and EEPROM can keep stored information without supplying supply power, the stored information is not changeable or a data access operation is slowly performed.

Thus, a non-volatile dynamic random access memory (NVDRAM), which can keep a data without supplying any power and can perform a data access operation on high speed, is continuously developed.

FIG. 1 is a schematic diagram showing a dynamic cell in a conventional volatile dynamic RAM device.

For example, in U.S. Pat. No. 4,471,471, issued on Sep. 11, 1984 to DiMaria and Donelli J. and entitled "NON-VOLATILE RAM DEVICE", there is provided a non-volatile dynamic random access memory (NVDRAM) having a multiplicity of floating gate in a field effect transistor DRAM characterized by a non-volatile memory. The NVDRAM uses the floating gate for storing information non-volatilely during a power failure and utilizes a double electron injector structure (DEIS) stack over the transfer gate for data recovery after resumption of power. A main disadvantage of this cell is that data cannot be transferred from a capacitor to a floating gate in parallel in all cells since the DEIS stack is located on the bit line side of the cell. The data first has to be read out by turning on the transfer transistor and sensing a voltage supplied on the bit line.

For solving the above disadvantage, U.S. Pat. No. 5,331, 188, issued on Jul. 19, 1994 to Acovic et al. and entitled "NON-VOLATILE DRAM CELL", discloses a compact one-transistor non-volatile DRAM cell and a method for fabricating same. In the Acovic et al., the DRAM cell has a tunnel oxide or dual electron injector structure disposed between a storage node and a floating gate for non-volatile data retention during power interruptions in a compact one transistor structure.

However, a plate line voltage of a capacitor in the above DRAM cell is coupled to a ground voltage. An electric filed of the capacitor is generated by only a voltage supplied to a word line and a bit line. Therefore, the floating gate should include two layers and the size of the DRAM cell should be increased. Also, a method and process for fabricating the DRAM cell may be more complex. In comparison with a DRAM cell of which a plate line voltage can be adjusted, the NVDRAM may consume larger power because the word line and the bit line should be supplied with a relatively high voltage.

For overcoming above described disadvantages, U.S. Ser. No. 10/749,356, filed on Dec. 31, 2003 to Ahn et al. and entitled "APPARATUS AND METHOD OF DRIVING NON-VOLATILE DRAM", discloses a non-volatile DRAM cell. However, in U.S. Ser. No. 10/749,356, the NVDRAM should repeatedly carry out a SRC process many times in a normal mode so that charges in a source can not be unlimitedly flowed into a floating gate. In addition, it is disadvantage that a control for preventing a threshold voltage from increasing because of the charges continuously inputted to the floating gate is more complex.

SUMMARY OF INVENTION

It is, therefore, an object of the present invention to provide a non-volatile dynamic random access memory (NVDRAM) having a trapping layer, which can trap electrons or holes, for being easy to control the NVDRAM.

In accordance with an aspect of the present invention, there is provided a driving circuit for use in a non-volatile dynamic random access memory (NVDRAM), which has a nonconductor which can trap electrons or holes, including an internal supply voltage generator for generating the plurality of internal supply voltages, each having at least two different voltage levels; a mode controller for determining an operation mode of the NVDRAM; a voltage level selector for selecting one voltage level of each internal supply voltage in response to the operation mode to thereby outputs the selected voltage level of each internal supply voltage to the row decoding block and the core area; a row decoding block for receiving the internal supply voltages and outputting the internal supply voltages in response to an inputted address; and a core area having a plurality of unit cells, each storing a data, for accessing the data in response to inputted voltage levels of the plurality of internal supply voltages.

BRIEF DESCRIPTION OF DRAWINGS

The above and other objects and features of the present invention will become apparent from the following description of preferred embodiments taken in conjunction with the accompanying drawings, in which:

FIG. 6B is a circuit diagram describing four operation modes of the NVDRAM shown in FIG. 3.

DETAILED DESCRIPTION OF THE INVENTION

Hereinafter, a non-volatile dynamic random access memory (NVDRAM) device will be described in detail with reference to the accompanying drawings.

Figure 1:
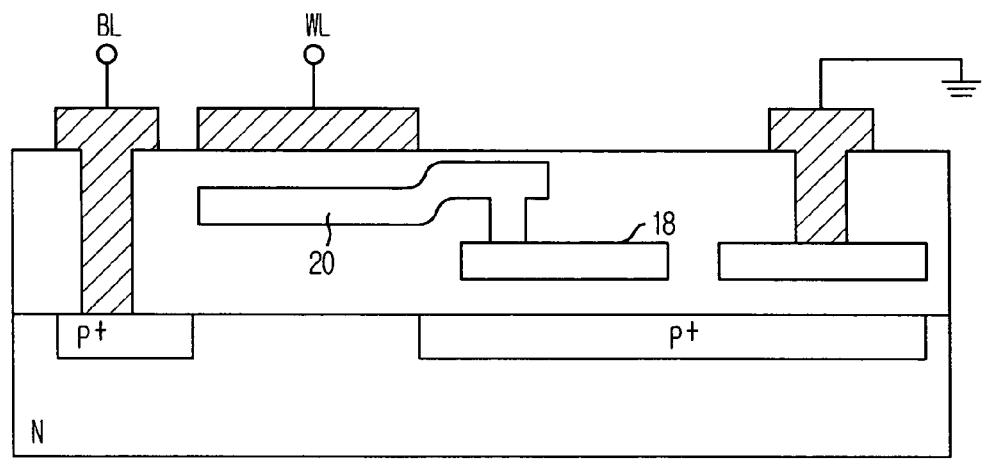
FIG. 1 is a sectional view describing a unit cell of a non-volatile dynamic random access memory (NVDRAM) in accordance with the prior art.
Figure 2A:
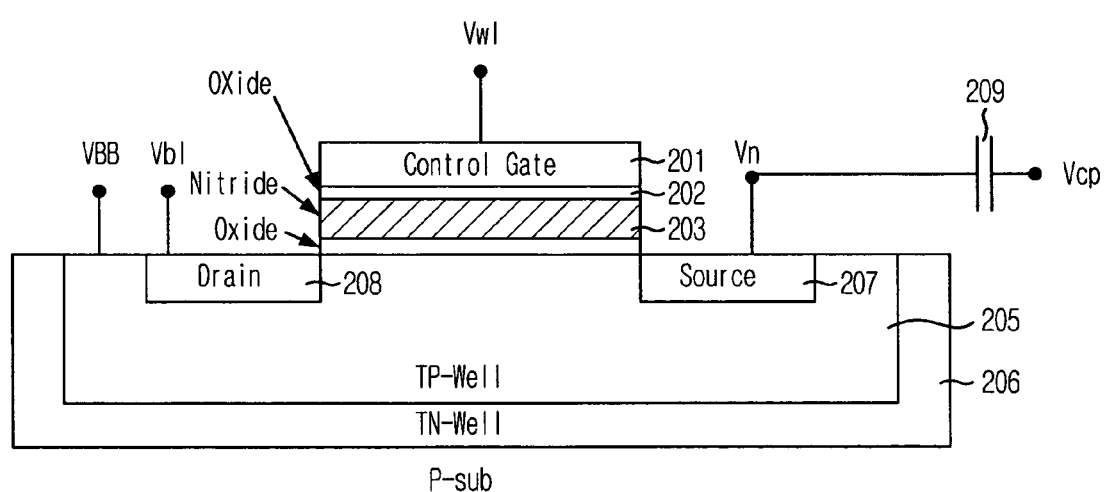
FIG. 2A is a sectional view showing a unit cell of an NVDRAM in accordance with the present invention.
Figure 2B:
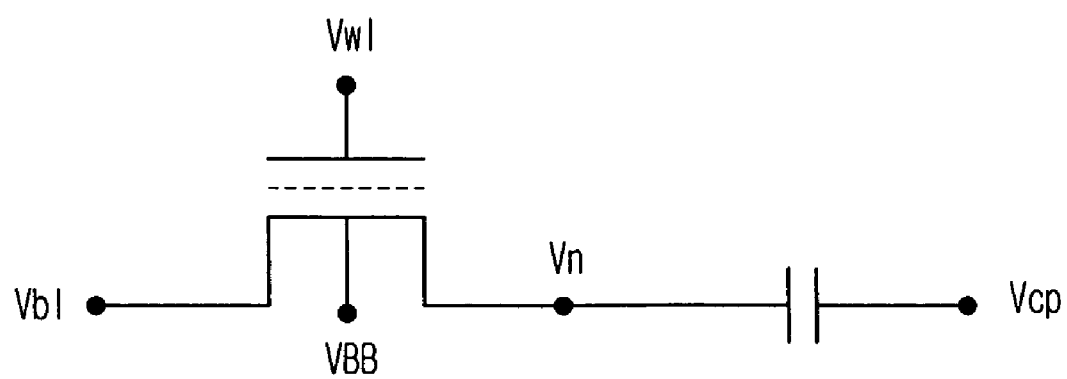
FIG. 2B is a schematic circuit diagram showing a unit cell of the NVDRAM in accordance with the present invention.

FIG. 2A is a sectional view showing a unit cell of an NVDRAM in accordance with the present invention. FIG. 2B is a schematic circuit diagram showing a unit cell of the NVDRAM in accordance with the present invention.

As shown in FIG. 2A, a DRAM cell includes a transistor and a capacitor 209. However, the transistor in the unit cell of the NVDRAM further includes a trapping layer 203 under a control gate 201. Herein, the trapping layer 203 made of non-conductor can trap electrons or holes.

In the present invention, the trapping layer 203 is provided with a single layer. Also, a plate line of the capacitor 209 is supplied with a plate line voltage $V_{cp}$ which is controllable, not a fixed voltage, e.g., a ground voltage. As a result, because of the plate line, a size of the unit cell can be decreased. Also, a method and process of fabricating the unit cell is more simplified. Moreover, because the capacitor 209 is supplied with a controllable plate line voltage, the NVDRAM can be operated by inputting a relatively low voltage at a word line and a bit line coupled to the unit cell. Namely, the NVDRAM of the present invention can reduce power consumption.

Herein, referring to FIG. 2A, the control gate 201 is made of a poly-silicon; and an oxide insulating layer 202 is located between the control gate 201 and the trapping layer 203. Another oxide insulating layer is located between the trapping layer 203 and a substrate.

Figure 3:
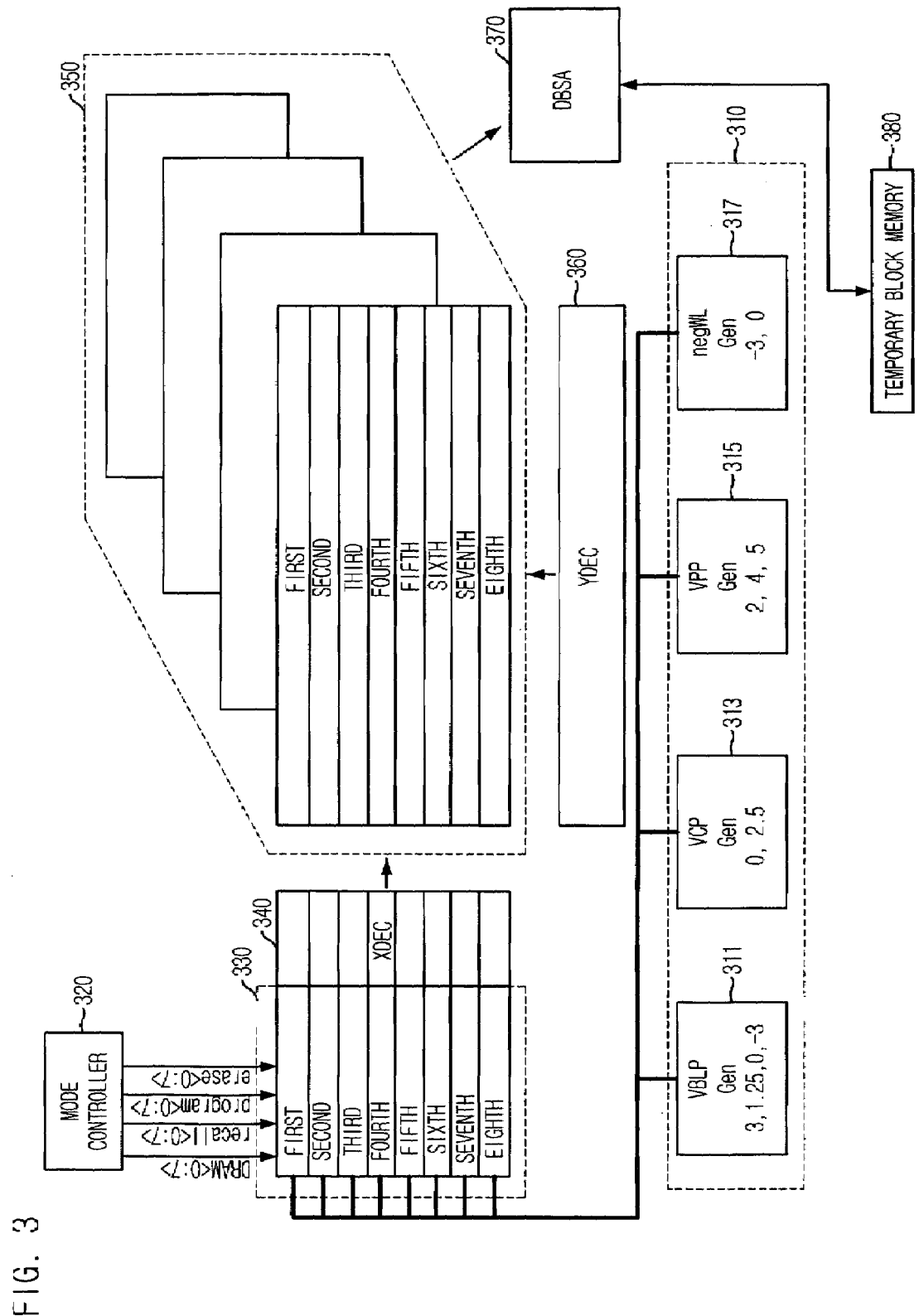
FIG. 3 is a block diagram describing driving circuit for use in the NVDRAM in accordance with the present invention.

FIG. 3 is a block diagram describing a driving circuit for use in the NVDRAM in accordance with the present invention.

As shown, the driving circuit includes an internal supply voltage generator 310, a mode controller 320, a voltage level selector 330, a row decoding block 340, a core area 350, a column decoding block 360 and a sense amplifying block 370.

The internal supply voltage generator 310 receives a supply voltage and generates a plurality of internal supply voltages. The mode controller 320 controls an operation mode of the NVDRAM such as a recall mode, a program mode and the like. The voltage level selector 330 receives the plurality of internal supply voltages and selectively outputs the internal supply voltages to the row decoding block 340 in response to the operation mode determined by the mode controller 320. The row decoding block 340 supplies an output voltage from the voltage level selector 330 into the core area 350. Herein, the core area 350 includes a plurality of banks, each having a plurality of cell array blocks, e.g., block 0 to block 7. In addition, each cell array block includes a plurality of unit cells shown in FIG. 2A.

In addition, the column decoding block 360 and the sense amplifying block 370 included in the driving block according to the present invention is the same to the conventional DRAM in their structures. Thus, detailed descriptions about the column decoding block 360 and the sense amplifying block 370 are omitted herein.

Furthermore, the driving circuit includes an temporary block memory 380 receiving an outputted data amplified by the sense amplifying block 370.

In detail, the internal supply voltage generator 310 includes a precharge voltage generator 311, a cell plate voltage generator 313, a positive voltage generator 315 and a negative voltage generator 317. The precharge voltage generator 311 is for generating a precharge voltage used for a precharge operation in each bit line. The cell plate voltage generator 313 is for generating a cell plate voltage supplied to a cell plate of each unit cell in the NVDRAM. For activating a word line or controlling an operation of each unit cell, the positive voltage generator 315 and the negative voltage generator 317 respectively generate a positive voltage and a negative voltage.

The voltage level selector 330 constituted with first to eighth level selectors selectively outputs the internal supply voltages to first to eighth blocks included in each bank of the core area 350 in response to the operation mode determined by the mode controller 320.

Figure 4:
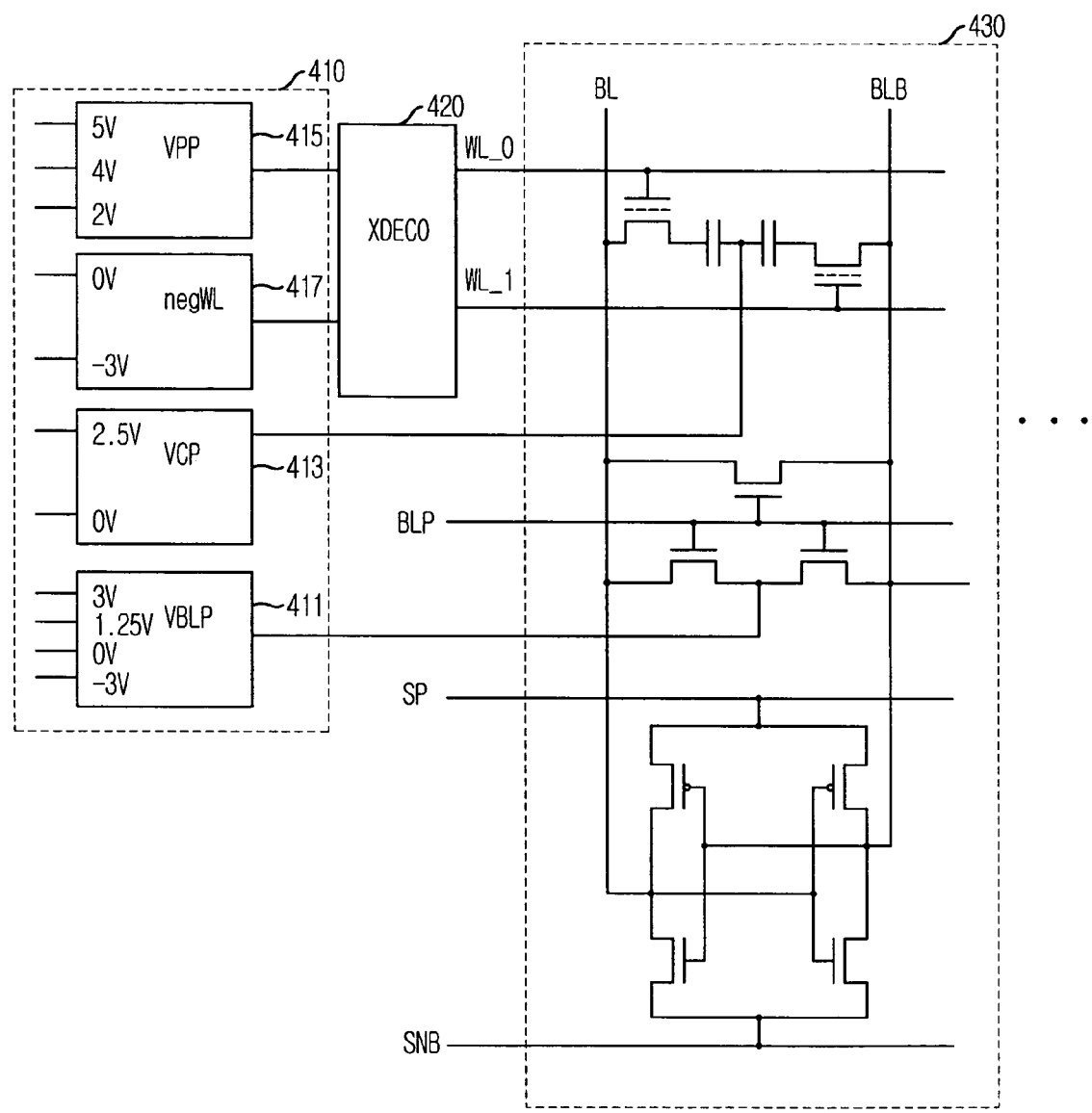
FIG. 4 is a block diagram depicting partial blocks for supplying positive and negative voltages to a word line in the NVDRAM shown in FIG. 4.

FIG. 4 is a block diagram depicting partial blocks for supplying a voltage to a core area of the NVDRAM shown in FIG. 3.

As shown, there are a first level selector 410, a first row decoder 420 and a first block 430. The first level selector 410 included in the voltage level selector 330 is corresponded with the first block 430 included in the core area 350. The first level selector 410 receives the plurality of internal supply voltages outputted from the internal supply voltage generator 310 and selectively outputs the positive voltage and the negative voltage to the first row decoder 420 in response to the operation mode determined by the mode controller 320. Also, the first level selector 410 outputs the cell plate voltage and the precharge voltage to the first block 430 in response to the operation mode determined by the mode controller 320.

In detail, the first level selector 410 includes a first positive voltage switch 415, a first negative voltage switch 417, a first cell plate voltage switch 413 and a first precharge voltage switch 411. In the first positive voltage switch 415, there are three voltage levels, i.e., 2V, 4V and 5V, outputted from the positive voltage generator 315 of the internal supply voltage generator 310. The first positive voltage switch 415 selects one of the three voltage levels inputted as the positive voltage in response to the operation mode determined by the mode controller 320 and outputs the selected level of the positive voltage to the first row decoder 420. Likewise, the first negative voltage switch 417 selects one of two voltage levels, i.e., 0V and −3V, inputted as the negative voltage from the negative voltage generator 315 in response to the operation mode determined by the mode controller 320 and outputs the selected level of the negative voltage to the first row decoder 420.

In addition, the first cell plate voltage switch 413 selects one of two voltage levels, i.e., 0V and 2.5V, inputted as the cell plate voltage from the cell plate voltage generator 313 in response to the operation mode determined by the mode controller 320 and outputs the selected level of the negative voltage to the first block 430. The first precharge voltage switch 411 selects one of four voltage levels, i.e., −3V, 0V, 1.25V and 3V, inputted as the precharge voltage from the precharge voltage generator 311 in response to the operation mode determined by the mode controller 320 and outputs the selected level of the negative voltage to the first block 430.

Figure 5:
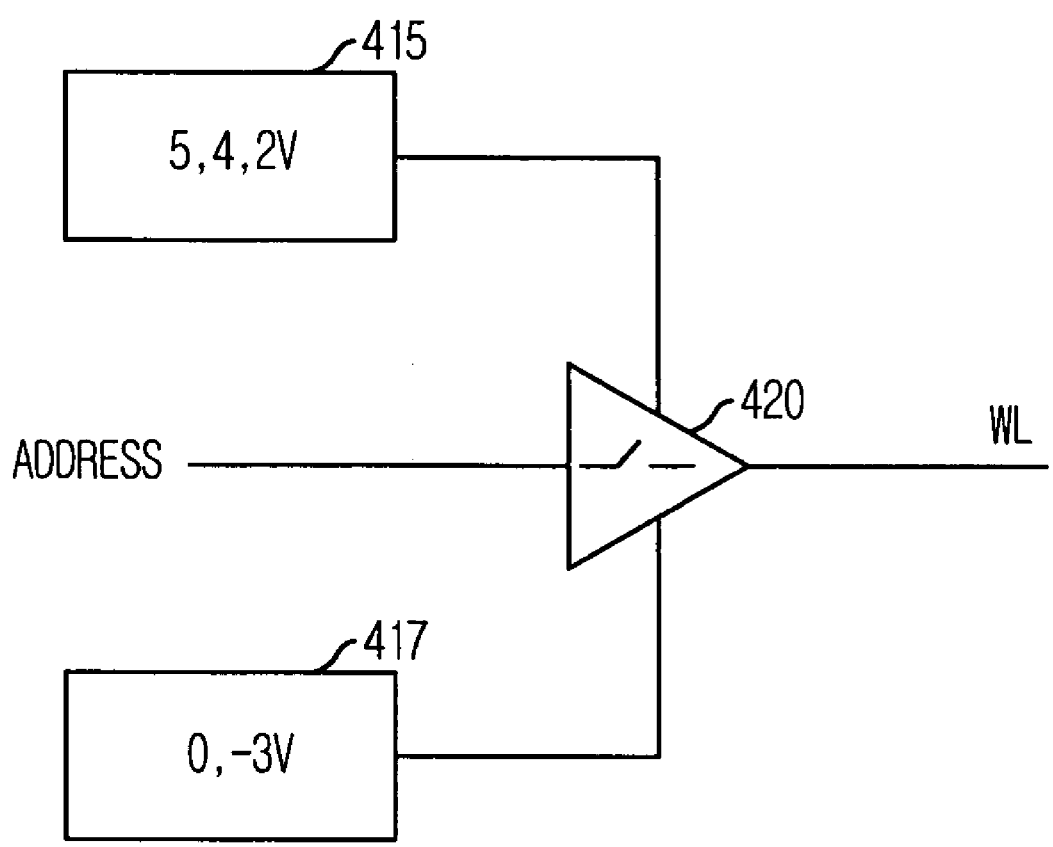
FIG. 5 is a block diagram showing partial block for supplying a voltage to a word line in the NVDRAM shown in FIG. 3.

FIG. 5 is a block diagram showing partial block for supplying the positive and negative voltages to a word line in the NVDRAM shown in FIG. 4.

As shown, the first row decoder 420 selectively outputs the inputted positive voltage from first positive voltage switch 415 and the inputted negative voltage from the first negative voltage switch 417 into the first block 430 in response to an inputted address ADDRESS.

Figure 6A:
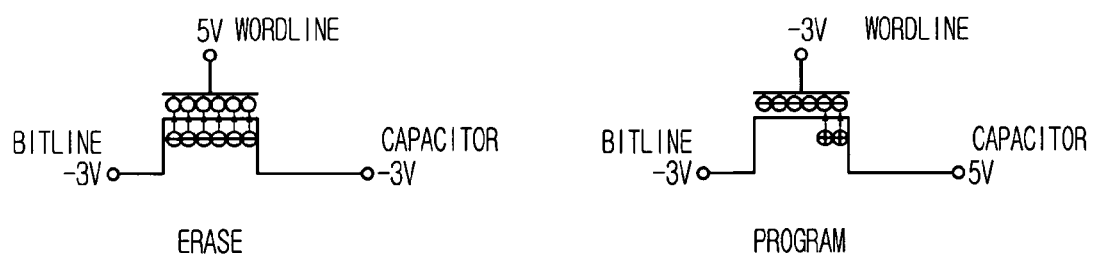
FIG. 6A is a circuit diagram describing an erase mode and a program mode of the NVDRAM shown in FIG. 3.

FIG. 6A is a circuit diagram describing an erase mode and a program mode of the NVDRAM shown in FIG. 3; and FIG. 6B is a circuit diagram describing four operation modes of the NVDRAM shown in FIG. 3.

Hereinafter, referring to FIGS. 6A and 6B, an operation of the unit cell included in the core area 350 is described in detail.

The NVDRAM holds data in each cell if the external voltage is isolated; otherwise, the NVDRAM operates as a volatile DRAM if the external voltage is supplied. Therefore, in the NVDRAM of the present invention, the operational mode includes four modes: a recall mode, a normalization mode, a DRAM mode and a program mode.

The recall mode RECALL is a process for delivering data stored in the trapping layer to the capacitor when the external voltage starts to be supplied. The erase mode ERASE is for equalizing each threshold voltage of all memory cells by charging the trapping layer with sufficient negative charges, e.g., electrons. The DRAM mode DRAM means that the NVDRAM device operates as the volatile DRAM device. The program mode PROGRAM is for delivering data stored in the capacitor to the trapping layer when the external voltage starts to be isolated. Hereinafter, the four modes of the NVDRAM device in accordance with the present invention are described in detail.

In the DRAM mode, the NVDRAM device operates as a volatile DRAM, thus description about an operation of the normal DRAM mode is omitted. However, contrary to the conventional NVDRAM having an oxide layer in a gate of each unit cell, a performance, e.g., a refresh cycle, of a refresh operation is improved because the NVDRAM includes a non-conductor which can trap electron charges in accordance with the present invention.

That is, in the unit cell, if data stored in the unit cell is erased, the sufficient charges, i.e., electrons, are trapped in the trapping layer. Thus, a threshold voltage of each unit cell is increased. If the NVDRAM is operated in the DRAM mode, the threshold voltage is higher than a threshold voltage of the conventional DVDRAM because of the trapped electron charges. As a result, when each unit cell is fabricated, a doping density of a substrate in the core area 350 should be lower than that of the conventional DVDRAM in order to prevent the threshold voltage from increasing.

If the doping density of the substrate in the core area 350 is lowered, an electric field of a junction between a transistor and the substrate of each unit cell is lowered; and, then, a leakage current of the junction is great reduced. Therefore, the performance of the refresh operation is dramatically improved.

Hereinafter, the operation modes of the NVDRAM are described in detail referring to FIGS. 2 to 6B.

Generally, in the unit cell of the conventional NVDRAM, the threshold voltage is lowered after the erase mode. Contrary to the conventional NVDRAM, the threshold voltage becomes higher in the erase mode ERASE of the NVDRAM according to the present invention because the trapping layer can trap sufficient electrons. Also, in the program mode PROGRAM of the NVDRAM according to the present invention, hot holes are generated from a part of junction between the trapping layer and the substrate near the capacitor. Namely, during the program mode PROGRAM, the hot holes are injected into a part of the trapping layer. However, if the erase mode ERASE is performed after the program mode PROGRAM, the trapping layer includes sufficient electrons again. As compared with the floating gate of the conventional NVDRAM, the trapping layer has no over-erase program because amount of electrons trapped by the trapping layer is limited. Herein, the over-erase program means that the threshold voltage of each unit cell is fluctuated, i.e., not saturated to a predetermined constant level, after the erase mode ERASE.

In the program mode, if the external voltage is unstable or isolated, the program mode for delivering data stored in the capacitor to the trapping layer is performed.

First of all, the plurality of memory cells is refreshed for clarifying stored data. For delivering the data into the trapping layer, very high voltage is needed to change the threshold voltage of each unit cell. Referring to FIG. 6A, in the program mode PROGRAM, the word line is supplied with a negative word line voltage of −3 V; and the cell plate is supplied with a cell plate voltage of 2.5 V for boosting up a voltage level of the storage node. Herein, it is assumed that voltage level of data stored in the capacitor has a range from about 0 V to about 2.5 V.

Then, if the memory cell stores a logic high data, a voltage difference between the word line and the storage node between the transistor and the capacitor is increased to 8 V. This voltage difference, i.e., 8V, is enough to cause a localized hot hole injection or a Fowler Nordheim (F-N tunneling) effect and, then, the hot holes are injected into the trapping layer. Herein, the localized hot hole injection and the F-N tunneling effect has an influence of a thickness of the oxide insulating layer between the trapping layer and the substrate.

On the other hand, if the localized hot hole injection and the F-N tunneling effect cannot be occurred because a capacitance of the unit cell is very small, the refresh operation and the program mode are repeatedly carried out in the unit cell.

When external power is supplied to the NVDRAM, the recall mode is carried out to retrieve the data by using a threshold voltage of each unit cell. In the recall mode, referring to FIG. 6B, the word line is supplied with a positive word line voltage of about 2 V; and the bit line is supplied with a precharge voltage of about 3 V. If the unit cell has a threshold voltage corresponding to a logic high data after the program mode, i.e., the threshold voltage is lowered, the precharge voltage of about 3V, i.e., a voltage level supplied to a drain of the capacitor, can supplied to the capacitor. In this case, a voltage transfer of about 2 V voltage level in the unit cell can be achieved because of relatively high voltage level in the drain of the transistor.

Otherwise, when the stored data is a logic low state, i.e., the threshold voltage of the unit cell is still high, the voltage transfer of only 0.8 V voltage level can be occurred in the unit cell if the threshold voltage of the unit cell is controlled in a manufacturing process so that the threshold voltage is set to be 1.2 V in the DRAM mode.

That is, according to a logic state of the stored data, there is occurred the voltage transfer of about 2 V and about 0.8 V. Then, if the refresh operation is carried out with the precharge voltage is set to be 1.25 V, the data can be retrieved into the capacitor, i.e., the recall mode RECALL is achieved successfully.

Simultaneously, to prevent the leakage current from the unit cell, a selected word line is supplied with a positive voltage such as 4 V and a non-selected word line is supplied with a negative voltage such as −3 V at a timing of sensing the data.

For clearing a data stored in each unit cell, the refresh operation is required. After recall mode, the data is refreshed and stored, i.e., backed up, in the temporary block memory 380. Herein, the charges captured in one side of the trapping layer closed to the source should be discharged.

The data stored in each capacitor of all memory cells are backed up respectively. A method for backing up the stored data can be determined based on a size of the temporary block memory 380. Namely, all data stored in the core area 350 can be simultaneously backed up in the temporary block memory 380. Also, data stored in each bank can be backed up in sequence. Herein, without regard to a memory type, the temporary block memory 380 can store a back-up data during a predetermined time. Herein, detailed descriptions about a back-up operation are omitted because the back-up operation as above described is not inventive scope of the present invention.

In the erase mode, the bit line and the substrate are supplied with about −3 V and the word line is supplied with about 5 V. Then, the F-N tunneling effect is occurred and, then, the threshold voltage is increased according to the trapped electron charges of the trapping layer. Namely, the preceding threshold voltage is changed. Finally, the threshold voltage of the unit cell is saturated. That is, if the stored data is a logic low state, almost electron charges is not tunneled; but, if the stored data is a logic high state, a lot of electron charges are tunneled and, then, the threshold voltage is going to be saturated. As a result, the threshold voltage saturated by trapped electron charges is controlled to be set as about 1±0.2V without a regard of a logic state of the stored data.

In conclusion, the internal supply voltages according to the operation modes are clearly described as the following table.

Figure 7:
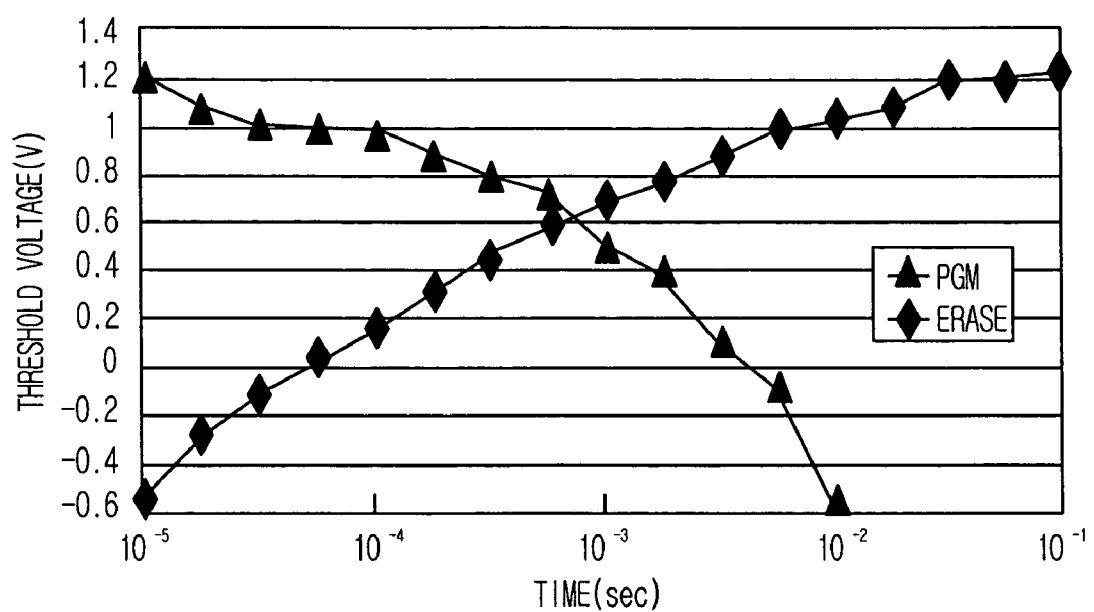
FIG. 7 is a waveform demonstrating a change of a threshold voltage of a transistor included in the unit cell of the NVDRAM according to an operating time.

FIG. 7 is a waveform demonstrating a change of a threshold voltage of a transistor included in the unit cell of the NVDRAM when the NVDRAM is operated in the program and erase modes.

As shown, in each of program and erase modes, it is described how to change a voltage level of the threshold voltage in the unit cell.

Consequently, on the basis of the above described preferred embodiments, the NVDRAM device can be controlled by supplying the word line, the bit line and the plate line of the capacitor in the memory cell with each different internal supply voltage.

More particularly, because the plate line of the capacitor can be supplied with each different voltage in response to the operation mode of the NVDRAM device, the NVDRAM device can be operated by a relatively low internal voltage. As a result, the NVDRAM device can reduce power consumption dramatically. Also, each operation mode of the NVDRAM can be easily controlled; and an operation speed of the NVDRAM can be increased.

In a manufacturing process, because the NVDRAM in accordance with the present invention is similar to the convention NVDRAM in their structures, a manufacturing cost can be reduced.

In addition, in the present invention, the doping density of the substrate in the core area 350 can be lowered and, then, a leakage current of the junction is great reduced. Therefore, the performance of the refresh operation is dramatically improved.

The present application contains subject matter related to Korean patent applications No. 2003-99897 and No. 2004-09745, respectively filed in the Korean Patent Office on Dec. 30, 2003 and on Feb. 13, 2004, the entire contents of which being incorporated herein by references.

While the present invention has been described with respect to the particular embodiments, it will be apparent to those skilled in the art that various changes and modification may be made without departing from the spirit and scope of the invention as defined in the following claims.

TABLE 1

Internal supply voltages according to the operation modes

| | DRAM | PROGRAM | power up | recall | refresh/backup | erase |
|---|---|---|---|---|---|---|
| wordline | | −3 V | 0 V | 2 V | | 5 V |
| bitline | | 1.25 V | 0 V | 3 V / 1.25 V | 2.5 V | −3 V |
| cell plate | | 2.5 V | 0 V | | | |
| storage node | Cell = H / Cell = L | 5 V | 0 V | Flash = H / 2 V / 0.8 V / Flash = L | 2.5 V / refresh | −3 V |
| VBB | | | | −0.8 V | | −3 V |
| cell Vtn @source | Vth (DRAM) | Flash = h | | Flash = H / −0.6 V / Flash = L | | |

What is claimed is:

1. A driving circuit for use in a non-volatile dynamic random access memory (NVDRAM) having a trapping layer which traps electrons/holes, comprising:
   an internal supply voltage generator for generating the plurality of internal supply voltages, each having at least two different voltage levels;
   a mode controller for determining an operation mode of the NVDRAM;
   a voltage level selector for selecting one voltage level of each internal supply voltage in response to the operation mode to thereby output the selected voltage level of each internal supply voltage to the row decoding block and the core area;
   a row decoding block for receiving the internal supply voltages and outputting the internal supply voltages in response to an inputted address; and
   a core area having a plurality of unit cells, each storing a data, for accessing the data in response to inputted voltage levels of the plurality of internal supply voltages.

2. The driving circuit as recited in claim 1, wherein the internal supply voltage generator includes:
   a precharge voltage generator for generating a precharge voltage used for a precharge operation in each bit line;
   a cell plate voltage generator for generating a cell plate voltage supplied to a cell plate of each unit cell;
   a positive voltage generator for supplying a positive voltage to a word line in response to the operation mode, wherein voltage levels of the positive voltage are over 0 V; and
   a negative voltage generator for supplying a negative voltage to a word line in response to the operation mode, wherein voltage levels of the second voltage are under 0 V.

3. The driving circuit as recited in claim 2, wherein the core area includes a plurality of banks, each having a plurality of cell blocks, each having a plurality of unit cells.

4. The driving circuit as recited in claim 2, wherein the voltage level selector includes a plurality of level selectors, each corresponded to each cell block.

5. The driving circuit as recited in claim 4, wherein the level selector includes:
   a positive voltage switch for determining a voltage level of the positive voltage in response to the operation mode;
   a negative voltage switch for determining a voltage level of the negative voltage in response to the operation mode;
   a cell plate voltage switch for determining a voltage level of the cell plate voltage in response to the operation mode; and
   a precharge voltage switch for determining a voltage level of the precharge voltage in response to the operation mode.

6. The driving circuit as recited in claim 1, wherein the unit cell includes:
   the trapping layer for serving as a temporary data storage;
   a control gate coupled to a word line;
   a first insulating layer between the control gate and the trapping layer;
   a source doped by a first conductive type;
   a drain doped by the first conductive type;
   a substrate doped by a second conductive type;
   a second insulating layer between the trapping layer and the substrate;
   a capacitor having one side coupled to the source for storing data; and
   a bit line coupled to the drain for delivering data,
   wherein a voltage level supplied to the other side of the capacitor is controllable.

7. The driving circuit as recited in claim 6, wherein the trapping layer is a nitride layer and the first and second insulating layers are an oxide layer.

8. The driving circuit as recited in claim 6, wherein the trapping layer is a group of an aluminum oxide $Al_2O_3$, a tantalum oxide $Ta_2O_5$ and a hafnium oxide $HfO_2$.

9. The driving circuit as recited in claim 8, wherein the control gate is one of a metal layer and a poly-silicon layer.

10. The driving circuit as recited in claim 9, wherein the first conductive type is N type and the second conductive type is P type.

11. The driving circuit as recited in claim 10, wherein the first conductive type is P type and the second conductive type is N type.

12. The driving circuit as recited in claim 6, wherein the operation mode is a recall mode for delivering data stored in the trapping layer to the capacitor when an external voltage starts to be supplied.

13. The driving circuit as recited in claim 12, wherein the operation mode is an erase mode for equalizing each threshold voltage of all memory cells by charging the trapping layer with the same amount of charges.

14. The driving circuit as recited in claim 13, wherein the operation mode is a DRAM mode for operating as a volatile DRAM device.

15. The driving circuit as recited in claim 14, wherein the operation mode is a program mode for delivering data stored in the capacitor to the trapping layer when the external voltage starts to be isolated.

16. The driving circuit as recited in claim 1, further comprising:
   a column decoding block for decoding the inputted address; and
   a sense amplifying block for amplifying the accessed data.

17. The driving circuit as recited in claim 16, further comprising an temporary block memory for backing up the data amplified by the sense amplifying block.

18. A method for operating a non-volatile dynamic random access memory (NVDRAM) device having a trapping layer which can trap an electron, comprising the steps of:
   (A) storing captured data of the trapping layer into a capacitor by using a voltage difference between a source and a drain;
   (B) adjusting a threshold voltage of a transistor in each cell to an operational threshold voltage by using a tunneling effect;
   (C) operating the memory cell in response to a read/write instruction; and
   (D) capturing the data stored in the capacitor by the trapping layer by using one of a localized hot hole injection and the tunneling effect.

19. The method as recited in claim 18, wherein each memory cell includes:
   the capacitor for storing data;
   the transistor for transmitting the data between the capacitor and a bit line; and
   the trapping layer for capturing the data when an external power is isolated.

20. The method as recited in claim 19, wherein each memory cell further includes:
   a first insulting layer on the trapping layer; and
   a second insulating layer beneath the trapping layer.

21. The method as recited in claim 19, wherein each memory cell further includes a first insulating layer beneath the trapping layer made of trapping.

22. The method as recited in claim 18, further comprising the steps of:
(E) backing up the captured data in the capacitor before the step (B); and
(F) restoring the backup data in the capacitor after the step (B).

23. The method as recited in claim 18, wherein the step (A) includes the steps of:
(A-1) discharging a node between the capacitor and the source of all memory cells;
(A-2) increasing a voltage level of the drain to be set as higher than that of the source according to a logic state of stored data in the trapping layer; and
(A-3) refreshing the plurality of capacitors.

24. The method as recited in claim 23, wherein the step (A) is carried out in a row basis.

25. The method as recited in claim 23, wherein the step (A-1) includes the steps of:
(A-1-a) supplying one or more than one word line connected to the plurality of memory cells with a high voltage in order to keep a voltage difference of about 2 V between the word line and a corresponding bit line; and
(A-1-b) writing a logical high datum in the memory cells corresponding to the one or more than one word line.

26. The method as recited in claim 25, wherein the step (A-2) includes the steps of:
(A-2-a) supplying one or more than one bit line connected to the plurality of memory cells with a high voltage in order to keep a voltage difference of about 1 V between the word line and a corresponding bit line; and
(A-2-b) supplying the memory cells with about 0 V as a bit line precharge voltage in order to storing data into the capacitors of the memory cells.

27. The method as recited in claim 26, wherein a reference voltage supplied to a bit line is an average of voltages, each determined according to logical high and low states data stored in the trapping layer.

28. The method as recited in claim 18, wherein the step (B) includes the steps of:
(B-1) backing up data stored in the trapping layer into the capacitor;
(B-2) increasing the threshold voltage by using the tunneling effect; and
(B-3) saturating the threshold voltage.

29. The method as recited in claim 28, wherein the step (B-2) includes the steps of:
(B-2-a) supplying each word line with a higher voltage of about 5 V in order to turning on the transistors; and
(B-2-b) charging the capacitor by supplying each bit line with a lower voltage of about −3 V.

30. The method as recited in claim 29, wherein in the step (B-3), the threshold voltage is set to be 1±0.2V.

31. The method as recited in claim 18, wherein the step (D) further includes the steps of:
(D-1) refreshing the trapping layer; and
(D-2) supplying a predetermined voltage to the cell plate in order to charge a part of the trapping layer by using a localized hot hole injection if a stored data is a logic high state.

32. The method as recited in claim 31, wherein the step (D-2) further includes the steps of supplying a voltage difference of about 8 V between the word line and a storage node by boosting up a voltage level of the storage level in response to the predetermined voltage of the cell plate.

33. The method as recited in claim 32, wherein the steps (D-1) and (D-2) are repeatedly preformed when a logic state of data is unstable.

* * * * *